(12) United States Patent
Tamada et al.

(10) Patent No.: US 6,465,810 B1
(45) Date of Patent: Oct. 15, 2002

(54) SEMICONDUCTOR LIGHT EMITTING DEVICE AND ITS MANUFACTURING METHOD

(75) Inventors: Hitoshi Tamada; Tohru Doumuki, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/328,409

(22) Filed: Jun. 9, 1999

(30) Foreign Application Priority Data

Jun. 19, 1998 (JP) .......................................... 10-173308

(51) Int. Cl.[7] .............................................. H01L 33/00
(52) U.S. Cl. .............................. 257/99; 257/94; 257/95; 257/96; 257/97; 257/98; 372/43; 438/20; 438/21; 438/22; 441/50; 441/51
(58) Field of Search ................. 257/94–99; 372/43–50; 438/20–22, 770–771; 441/50–51

(56) References Cited

U.S. PATENT DOCUMENTS 5,138,624 A * 8/1992 Hong et al. ................... 372/45
5,592,505 A * 1/1997 Leger ........................... 372/99

* cited by examiner

Primary Examiner—Douglas A. Wille
Assistant Examiner—Wai-Sing Louie
(74) Attorney, Agent, or Firm—Sonnenschein, Nath & Rosenthal

(57) ABSTRACT

A semiconductor light emitting device easily controlled in reflectance of its cavity edges has formed on the cavity edges of its laser cavity rugged structures including elongated concave portions extending substantially in parallel with bonded surfaces of semiconductor layers forming the laser cavity. The laser cavity is made by sequentially stacking on a substrate an n-type AlGaN cladding layer, n-type GaN optical guide layer, InGaN active layer, p-type GaN optical guide layer and p-type AlGaN cladding layer. The rugged structure is made by first making the cavity edges by etching and then processing the cavity edges by wet etching so that the cavity edges are selectively excavated due to differences in chemical property among semiconductor layers forming the laser cavity caused by differences in composition among them.

15 Claims, 10 Drawing Sheets

SEMICONDUCTOR LIGHT EMITTING DEVICE AND ITS MANUFACTURING METHOD

RELATED APPLICATION DATA

The present application claims priority to Japanese Application No. P10-173308 filed Jun. 19, 1998, which application is incorporated herein by reference to the extent permitted by law.

BACKGROUND OF THE INVENTION

1. Field of the Invention

This invention relates to a semiconductor light emitting device and its manufacturing method.

2. Description of the Related Art

Known as a sort of semiconductor lasers are so-called etched mirror lasers whose cavity edges are cut surfaces made by etching, or pseudo surface-emitting lasers incorporating raising mirrors into such etched mirror lasers. In these etched mirror lasers and pseudo surface-emitting lasers, heretofore used is a multi-layered film coating technology similar to a technology used in cleaved lasers having cleaved surfaces as their cavity edges, for controlling their refractive indices to increase or decrease refractive indices of their cavity edges.

The multi-layered coating technology is one of technologies already established and indispensable for controlling refractive indices of cavity edges of cleaved lasers which are processed for each bar divided from a wafer.

However, the multi-layered film coating technology is not always suitable for devices, such as etched mirror lasers or pseudo surface-emitting lasers whose cavity edges can be made in a wafer process using dry etching and not by cleavage.

More specifically, if a multi-layered thin-film coating is applied to cavity edges still held on a wafer, then particles of a coating material enter largely aslant (with a large incident angle) relative to the cavity edge, and the profile of the thickness of the coating film is liable to become uneven along the wafer surface.

Therefore, in order to prevent such uneven profile of the film thickness, the process of multi-layered thin-film coating on the cavity edges cannot be conducted while the product still maintains the state of a wafer, but had to follow after the wafer was cleaved into bars. As a result, the conventional technique could not make use of the advantage of etched mirror lasers that all can be manufactured in a wafer process, without coating.

Moreover, a GaN semiconductor laser capable of emitting blue-violet light was developed recently (for example, S. Nakamura, et al., Appl. Phys. Lett. 72, 211(1998)), and it is expected that semiconductor lasers will be progressed in shortening their emission wavelengths toward the ultraviolet region. However, although multi-layered thin-film coating techniques have been established for AlGaAs semiconductor lasers having emission wavelengths in the band of 800 nm, it will be difficult to employ them particularly for fabrication of high-power semiconductor lasers due to insufficient materials with high refractive indices, which are transparent in the above-mentioned short wavelength region. Also in semiconductor lasers for other wavelength bands, it will be difficult to control edge reflectance unless appropriate multi-layered thin-film coating materials are provided.

OBJECTS AND SUMMARY OF THE INVENTION

It is therefore an object of the invention to provide a semiconductor light emitting device easily controlled in reflectance of cavity edges and a manufacturing method capable of easily manufacturing such a semiconductor light emitting device.

According to the first aspect of the invention, there is provided a semiconductor light emitting device comprising a rugged structure including concave portions and/or convex portions made on at least one of cavity edges of a cavity thereof to extend substantially in parallel with bonded surfaces of semiconductor layers forming the cavity.

According to the second aspect of the invention, there is provided a semiconductor light emitting device comprising a rugged structure including dot-shaped concave portions and/or convex portions made on at least one of cavity edges of a cavity thereof.

According to the third aspect of the invention, there is provided a method for manufacturing a semiconductor light emitting device having a rugged structure including concave portions and/or convex portions made on at least one of cavity edges of a cavity thereof to extend substantially in parallel with bonded surfaces of semiconductor layers forming the cavity, comprising:

forming the rugged structure by making the concave portions on the cavity edge by etching, utilizing differences in chemical property among these semiconductor layers forming the cavity caused by differences in composition among them or the presence or absence of distortion at bonded interfaces thereof.

In the present invention, reflectance of the cavity edge having formed the rugged structure is controlled by repetitive distance of the concave portions or convex portions of the rugged structure, depth of the concave portions of height of the convex portions in the rugged structure, duty ratio of the rugged structure, and cross-sectional configuration of the rugged structure. In this case, reflectance of the cavity edge having formed the rugged structure can be controlled so that opposite cavity edges of the cavity be different in reflectance.

In the present invention, both cavity edges of the cavity may have the rugged structures. In this case, it is possible to control values of reflectance of the respective cavity edges independently by independently determining the repetitive distance of the concave portions or convex portions of the rugged structure, depth of the concave portions of height of the convex portions in the rugged structure, duty ratio of the rugged structure, and cross-sectional configuration of the rugged structure for respective cavity edges such that, for example, one of the cavity edges has a lower reflectance while the other cavity edge has a higher reflectance. Additionally, the first and second aspects of the invention may be combined to make on one of the cavity edges the rugged structure including concave portions and/or convex portions extending substantially parallel with bonded surfaces of the semiconductor layers forming the cavity and make on the other cavity edge the rugged structure including dot-shaped concave portions and/or convex portions. Alternatively, it is also possible to make on one of the cavity edges the rugged structure including concave portions and/or convex portions extending substantially in parallel with bonded surfaces of the semiconductor layers forming the cavity or the rugged structure including dot-shaped concave portions and/or convex portions while making on the other cavity edge a rugged structure including concave-portions and/or convex portions extending substantially vertically of bonded surfaces of the semiconductor layers forming the cavity.

In the present invention, the repetitive distance of concave portions and/or convex portions in the rugged structure is preferably shorter than the wavelength of outgoing light from the cavity edge from the viewpoint of preventing that the outgoing light from the cavity edge is diffracted by the rugged structure.

In the present invention, the cavity edge having formed the rugged structure may be coated with a single-layered or multi-layered film. This is useful because the coating film on the cavity edge functions as a passivation film to improve reliability of the cavity edge and adjust the edge reflectance.

In the present invention, the rugged structure may be formed, for example, either by making concave portions on the cavity edge by etching or by stacking a film to make convex portions on the cavity edge.

According to the first aspect of the invention having the above-explained features, since at least one of cavity edges of the cavity has formed the rugged structure including concave portions and/or convex portions extending substantially in parallel with bonded surfaces of semiconductor layers forming the cavity, reflectance of the cavity edge can be controlled easily without using multi-layered thin-film coating techniques.

According to the second aspect of the invention having the above-explained features, since at least one of cavity edges of the cavity has formed the rugged structure including dot-shaped concave portions and/or convex portions, reflectance of the cavity edge can be controlled easily without using multi-layered thin-film coating techniques, similarly to the first aspect of the invention.

According to the third aspect of the invention having the above-explained features, when manufacturing the semiconductor light emitting device according to the first aspect of the invention, by forming the rugged structure by making concave portions on the cavity edge by etching, utilizing differences in chemical property among semiconductor layers forming the cavity caused by differences in composition among these semiconductor layers or the presence or absence of distortion at the bonded interfaces of the semiconductor layers, a repetitive distance of concave portions or convex portions of the rugged structure and a duty ratio of the rugged structure can be realized with a remarkable reproducibility. Especially when the semiconductor light emitting device to be manufactured is an etched mirror laser having etching edges as its cavity edges, all can be manufactured in a wafer process. Therefore, this is particularly effective when used for manufacturing etched mirror lasers.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

In a semiconductor light emitting device according to the invention, cavity edges have formed rugged structures to control reflectance of the cavity edges. Reflectance of the cavity edges having rugged structures were obtained by calculation using RCWA (Rigorous Coupled-Wave Analysis) (T. K. Gaylord and M. G. Moharam, Proc. IEEE 73, 894(1985)), taking the following model.

Figure 1:
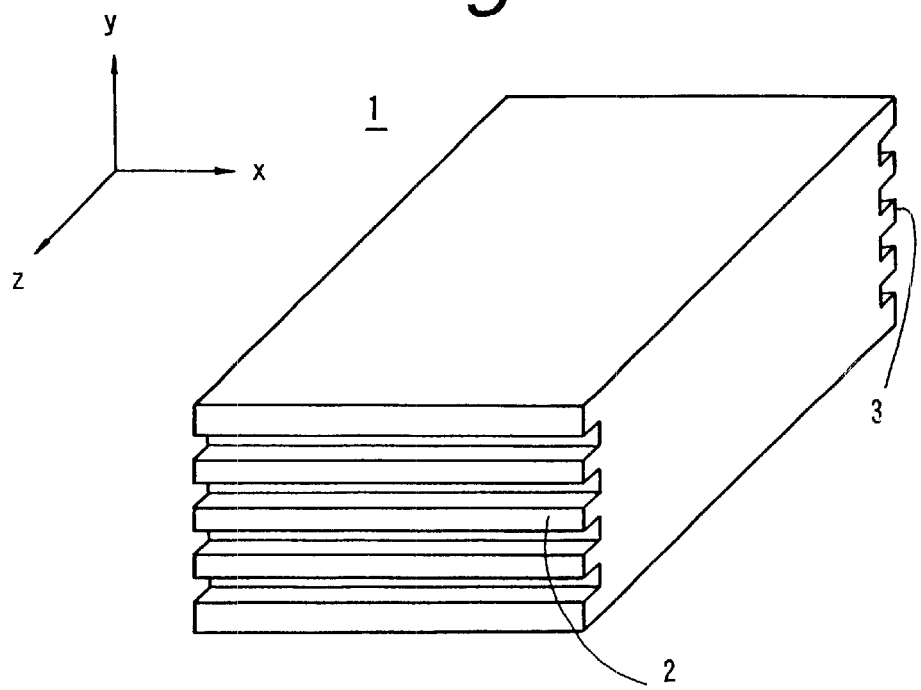
FIG. 1 is a perspective view of a semiconductor laser as a model used for calculation of reflectance of cavity edges by RCWA.

FIG. 1 shows a semiconductor laser used as a model for calculation of edge reflectance by RCWA. As shown in FIG. 1, the semiconductor laser shown here has formed grating-shaped rugged structures made up of elongated concave portions and convex portions formed on cavity edges 2, 3 of a laser cavity 1 to extend alternately in a direction substantially parallel to bonded surfaces of semiconductor layers forming the laser cavity 1. In this case, the rugged structured formed on the cavity edges 2, 3 have a rugged cycle in the direction vertical to the bonded surfaces of the semiconductor layers forming the laser cavity 1.

In FIG. 1, let the direction parallel to bonded surfaces of semiconductor layers forming the laser cavity be the x direction, the direction normal to bonded surfaces of semiconductor layers forming the laser cavity be the y direction, and the normal direction of the cavity edges be the z direction. In the laser cavity 1, both cavity edges 2, 3 are substantially vertical to the major surface of the substrate, not shown, and the normal direction of the cavity edges 2, 3 approximately coincides with the lengthwise direction of the laser cavity 1.

Figure 2:
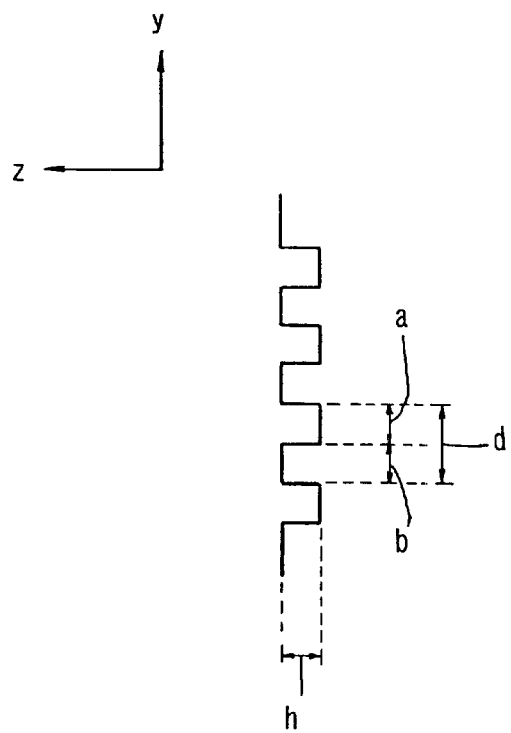
FIG. 2 is a schematic diagram showing a rugged structure on a cavity edge of the semiconductor laser shown in FIG. 1.

FIG. 2 is a schematic diagram showing the rugged structure on the cavity edge 2 to show an aspect of the rugged structure when the cavity edge 2 is viewed from the direction vertical to the yz plane in FIG. 1. In FIG. 2, dimension d represents the rugged cycle of the rugged structure (repetitive distance of concave portions or convex portions), and dimension h represents the depth of each concave portion (or height of each convex portion) in the rugged structure. If the width of each concave portion is a, and the width of each convex portion is b, then the rugged cycle d is expressed by d=a+b. In this case, the cross-sectional configuration of the rugged structure is rectangular. The same rugged structure is formed also on the other cavity edge 3.

Figure 3:
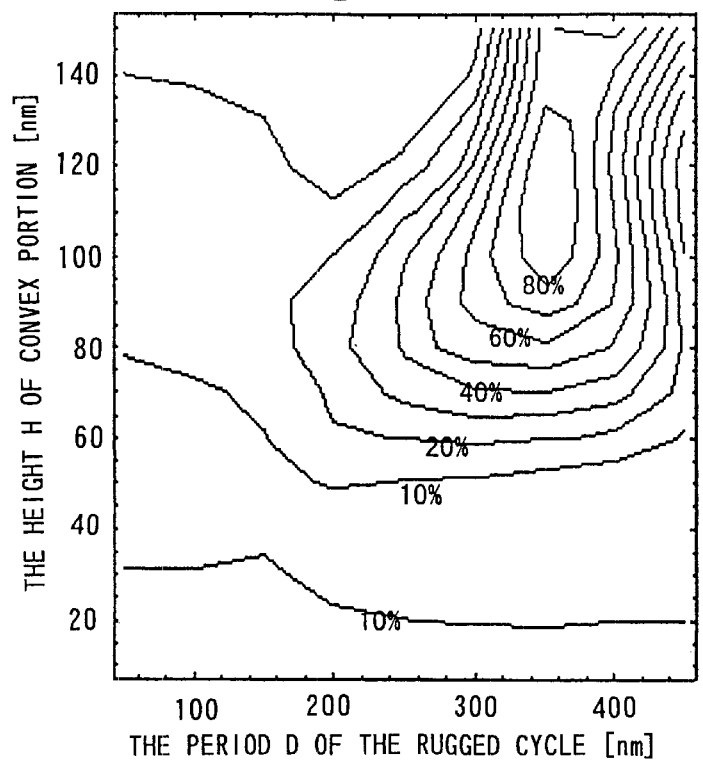
FIG. 3 is a graph showing a result of RCWA calculation by of reflectance of a cavity edge of the semiconductor laser shown in FIG. 1, letting its oscillation wavelength be λ=420 nm.

Assume here that the semiconductor laser is a GaN semiconductor laser having the oscillation wavelength $\lambda$=420 nm. FIG. 3 shows the relation of reflectance of the cavity edge obtained by RCWA with the rugged cycle d and the height h (nm) of the convex portion, taking the case where the rugged structure having a rectangular cross-sectional configuration is formed on the cavity edge (GaN/ air interface) (FIGS. 1 and 2) in the GaN semiconductor laser of $\lambda$=420 nm. In FIG. 3, the abscissa is the rugged cycle d (nm), the ordinate is the height h of the convex portion (nm), and edge reflectance is shown by contour lines on the d-h plane. Here are assumed as the rugged duty ratio in the rugged structure (width b of the convex portion/concav-convex cycle d) being 1/2, polarized light of the laser light being straight-polarized light, and the direction of its electric field being parallel (x direction) to bonded surfaces of semiconductor layers forming the laser cavity 1.

It is noted from FIG. 3 that, in the case of the grating-shaped rugged structure having the rugged cycle in the direction vertical to bonded surfaces of semiconductor layers forming the laser cavity 1, reflectance of the cavity edge changes from approximately 1% (for example, d=350 nm, h=40 nm) to approximately 85% (for example, d=350 nm, h=110 nm), depending upon the rugged cycle d and the height h of the convex portion. Since reflectance of the flat GaN/air interface is constantly about 18%, it is understood that, by making the above-mentioned rugged structure on the cavity edge, reflectance of the cavity edge can be readily controlled from a low reflectance around 1% to a high reflectance around 85% by appropriately determining the rugged cycle of the rugged structure and the height h of the convex portion without applying multi-layered thin-film coating. However, the rugged cycle d is preferably shorter than the oscillation wavelength $\lambda$ to ensure that the rugged structure never diffracts outgoing light from the cavity edge. Thus, even with the rugged structure on the cavity edge, outgoing light can be taken out as a single luminous flux.

Although FIG. 3 shows the result of calculation of reflectance obtained when the grating-shaped rugged structure with the rugged cycle d is formed on the cavity edge, reflectance of approximately 30% is obtained in the range of rugged cycle d from 240 to 410 nm when the height h of the convex portion is approximately 70 nm, for example, and reflectance of approximately 80% is obtained in the range of the convex height h from 95 to 130 nm when the rugged cycle d is 350 nm. From these facts, for obtaining a desired reflectance, the rugged structure will not need to be a grating of a substantially complete single cycle, but a certain degree of fluctuation will be acceptable for the repetitive distance of concave or convex portions and/or the convex height (concave depth).

Figure 4:
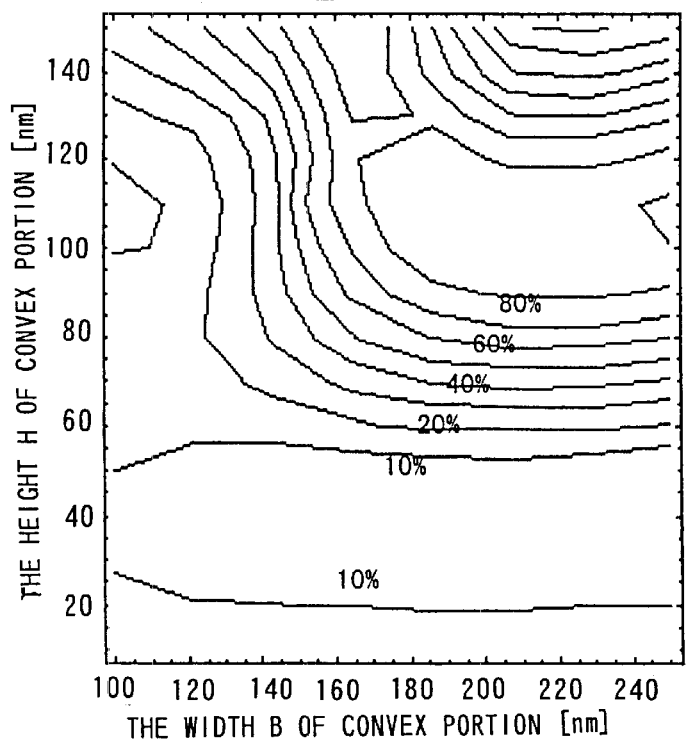
FIG. 4 is a graph showing a result of RCWA calculation by of reflectance of a cavity edge of the semiconductor laser shown in FIG. 1, letting its oscillation wavelength be λ=420 nm.

Next shown in FIG. 4 is the relation of reflectance of the cavity edge obtained by RCWA with the convex width b and the convex height d, taking the case where the rugged cycle d of the grating-shaped rugged structure formed on the cavity edge is constantly d=350 nm. In FIG. 4, the abscissa is the convex width b, the ordinate is the convex height h, and edge reflectance is shown by contour lines on the b-h plane.

It is noted from FIG. 4 that reflectance of approximately 30% is obtained in the range of convex width b from 160 to 260 nm when the convex height h is approximately 70 nm and that, when the convex width b is 140 nm, the same reflectance is obtained in the range of convex height h from 70 to 120 nm. Therefore, the rugged duty ratio and the convex height (concave depth) in the rugged structure need not be constant, but a certain degree of fluctuation will be acceptable.

As explained above, in the semiconductor laser shown in FIG. 1, which has formed on the cavity edges 2, 3 the grating-shaped rugged structures having a rugged cycle in the vertical direction to bonded surfaces of semiconductor layers forming the laser cavity 1, reflectance of the cavity edges can be controlled from a low reflectance around 1% to a high reflectance around 85% (when $\lambda$=420 nm) by controlling the rugged cycle, convex height or concave depth, and rugged duty ratio. Additionally, in this case, the rugged structure need not be a completely cyclic grating, but a certain degree of fluctuation is acceptable for the rugged cycle d, convex height h (concave depth) and duty ratio. Furthermore, reflectance of the cavity edges also depends upon the cross-sectional configuration of the rugged structure, and there is a difference in parameters for giving a desired reflectance, namely, rugged cycle d, duty ratio b/d and convex height h, between a structure having a rectangular cross-sectional configuration and a structure having a triangular or wevy cross-sectional configuration, for example.

Figure 5:
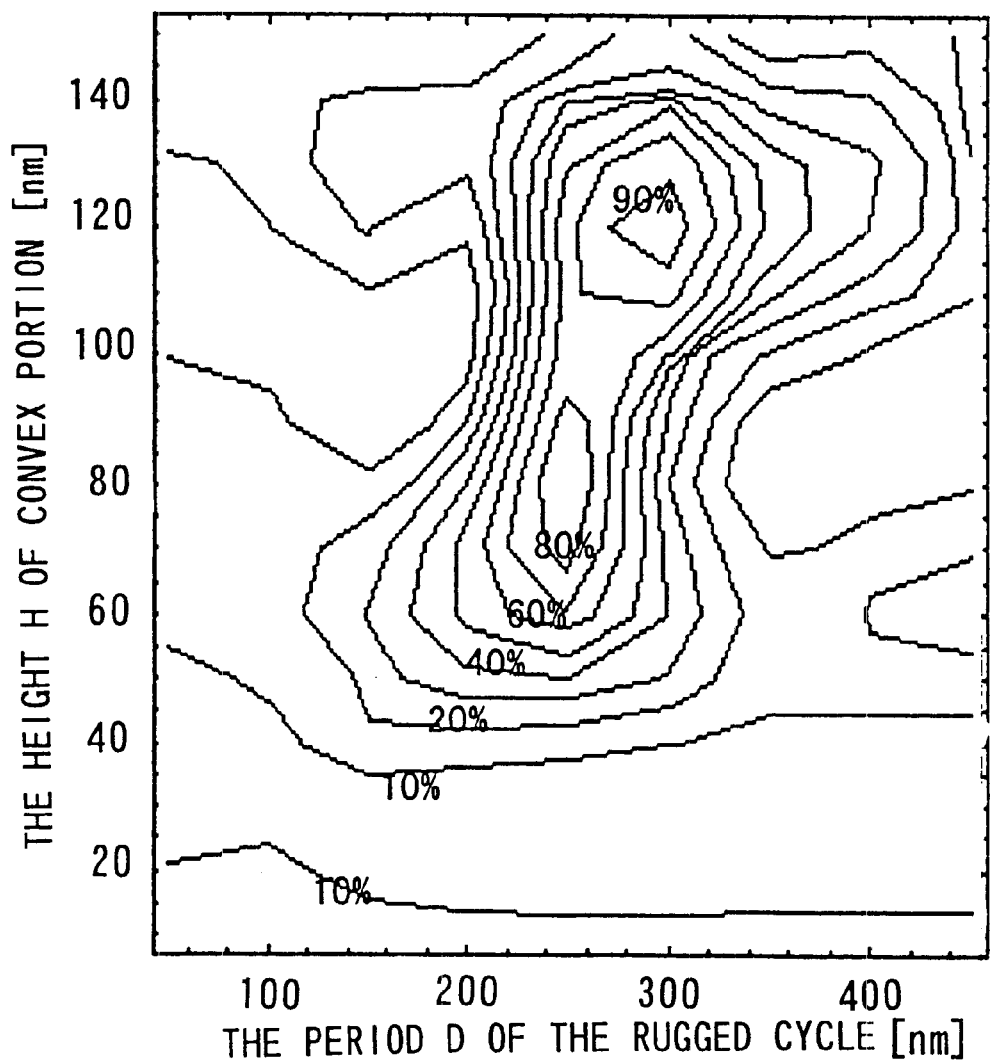
FIG. 5 is a graph showing a result of RCWA calculation by of reflectance of a cavity edge of the semiconductor laser shown in FIG. 1, letting its oscillation wavelength be λ=300 nm.

Next made is consideration on the case where the semiconductor laser shown in FIG. 1 is a GaN semiconductor having the oscillation wavelength $\lambda$=300 nm. FIG. 5 shows the relation of reflectance of the cavity edge obtained by RCWA with the rugged cycle d and the convex height h (nm), taking the case where the rugged structure having a rectangular cross-sectional configuration is formed on the cavity edge (GaN/air interface)(see FIGS. 1 and 2) in the GaN semiconductor laser of $\lambda$=300 nm. In FIG. 5, the abscissa is the rugged cycle d (nm), the ordinate is the convex height h (nm), and edge reflectance is shown by contour lines on the d-h plane. Here are assumed as the rugged duty ratio in the rugged structure (width b of the convex portion/rugged cycle d) being 1/2, polarized light of the laser light being straight-polarized light, and the direction of its electric field being parallel to bonded surfaces of semiconductor layers forming the laser cavity 1.

It is noted from FIG. 5 that, also in the case of $\lambda$=300 nm, reflectance of the cavity edges changes from approximately 0.1% (for example, d=300 nm, h=30 nm) to approximately 95% (for example, d=300 nm, h=120 nm), depending upon the rugged cycle d and the convex height h.

In this range of ultraviolet light, coating by a multi-layered thin-film with a high reflectance is especially difficult because transparent materials with high refractive indices are not affluent, and control of edge reflectance by the present invention is therefore effective.

A semiconductor laser as shown in FIG. 1, namely, the semiconductor laser having formed on its cavity edges the rugged structures made up of concave portions and/or convex portions extending substantially parallel to bonded surfaces of semiconductor layers forming the laser cavity, can be fabricated as explained below, for example.

That is, the semiconductor laser is usually manufactured by sequentially growing a plurality of semiconductor layers forming a laser structure (laser cavity) on a substrate (not shown) by metal organic chemical vapor deposition (MOCVD), for example.

In a semiconductor laser with an ordinary double-hetero structure, semiconductor layers forming the laser structure have a multi-layered structure of at least three layers, namely, a first cladding layer of a first conduction type (for example, n-type cladding layer), active layer and a second cladding layer of a second conduction type (for example, p-type cladding layer). In terms of composition, the multi-layered structure includes at least two kinds of layers different in composition, namely, a layer of a first composition corresponding to the active layer and a layer of a second composition corresponding to the cladding layer. In a semiconductor laser of a SCH structure in which an optical guide layer is interposed between the active layer and the cladding layer, semiconductor layers forming the laser structure have a multi-layered structure of at least five layers and including at least three kinds of layers different in composition.

Therefore, in case of a cleaved laser having cleaved surfaces as its cavity edges, after the cavity edges are made by cleaving the semiconductor layers forming the laser structure together with the substrate, the cavity edges are processed by wet etching, for example, using an appropriate etchant and using a difference in etching rate due to a difference in chemical property among different layers, thereby to make a rugged structure in which only portions corresponding to the active layer, for example, become convex or concave on the cavity edges (incase of a double-hetero structure) or a rugged structure in which only the optical guide layer between the active layer and the cladding layer, for example, become convex or concave.

In case of an etched mirror laser having etched edges as its cavity edges, by determining an appropriate dry etching condition upon making cavity edges by etching semiconductor layers forming the laser structure by dry etching, the rugged structure is made simultaneously when the cavity edges are made. Alternatively, by first making etching edges as cavity edges and then processing the cavity edges by wet etching using an appropriate etchant, the rugged structures are made on the cavity edges. For the etching process performed after the etching edges are made as cavity edges, dry etching may be used.

Therefore, the rugged structures as shown in FIG. 1 can be made on the cavity edges through an etching process such as dry etching or wet etching by appropriately changing composition of semiconductor layers forming the laser structure in their stacked direction or by providing a distortion in an appropriate region in the stacked direction of the semiconductor layer forming the laser structure so as to make a difference in chemical property. Additionally, the rugged cycle in the rugged structure (repetitive distance of concave portions or convex portions) and the rugged duty ratio can be realized with a remarkably good reproducibility. Furthermore, the convex height (or concave depth) in the rugged structure can be controlled with a good reproducibility by controlling conditions of dry etching or wet etching.

In the semiconductor laser shown in FIG. 1, it is possible to configure one of the cavity edges (for example, the front side edge) to have a lower reflectance and the other cavity edge (for example, the rear side edge) to have a higher reflectance, for example, by using different conditions for dry etching or wet etching of the cavity edges 2 and 3 of the laser cavity 1, respectively.

Especially in an etched mirror laser, small irregularities are liable to be made on its cavity edges upon dry etching for making the cavity edges or upon wet etching for removing etching residues after dry etching due to a difference in composition among semiconductor layers forming the laser structure. Such irregularities are generally regarded to cause a decrease of reflectance of cavity edges. Actually, according to the result of calculation of reflectance shown in FIG. 3, reflectance monotonously decreases from 18% to 1% within the range to 40 nm of the convex height h. In this case, by elongating the time of wet etching to increase the rugged depth, such decrease in reflectance can be prevented.

Figure 6:
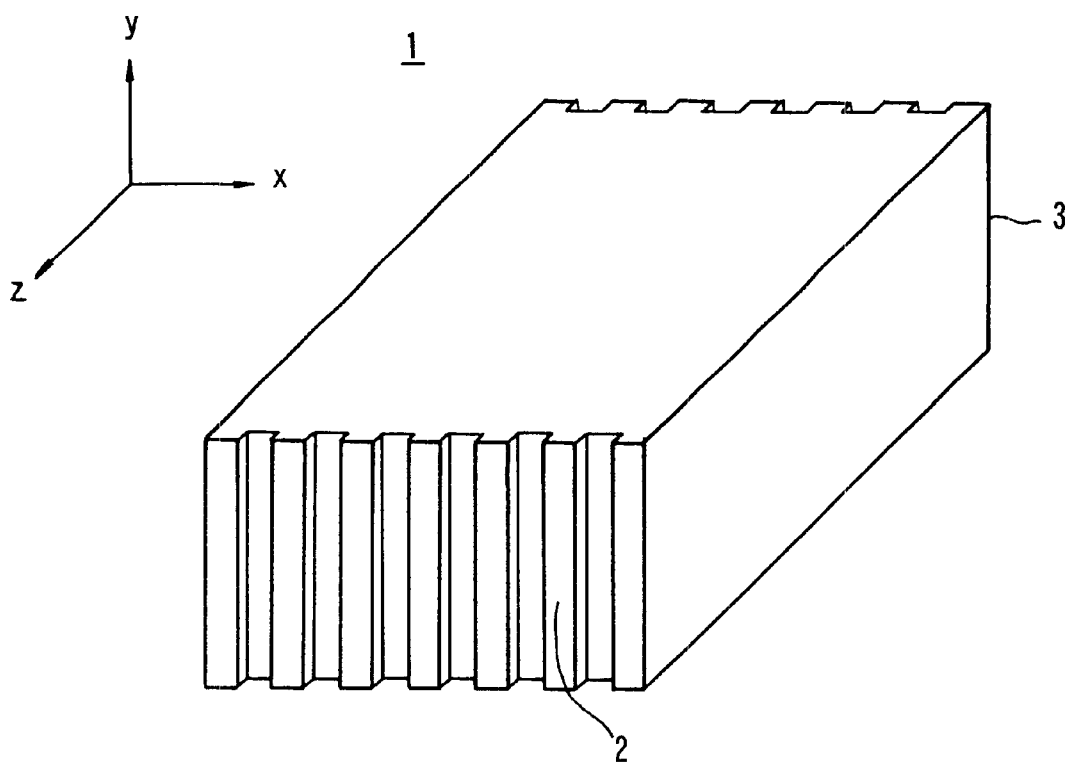
FIG. 6 is a perspective view of a semiconductor laser as another model used for calculation of reflectance of a cavity edge by RCWA.

Next shown in FIG. 6 is another semiconductor laser as a model for calculation of edge reflectance by RCWA. In FIG. 6, the same or corresponding portions to those in FIG. 1 are labeled with common reference numerals. As shown in FIG. 6, the semiconductor laser shown here has formed grating-shaped rugged structures made up of elongated concave portions and convex portions formed on cavity edges 2, 3 of a laser cavity 1 to extend alternately in a direction substantially vertical to bonded surfaces of semiconductor layers forming the laser cavity 1. In this case, the rugged structured formed on the cavity edges 2, 3 have a rugged cycle in the direction parallel to the bonded surfaces of the semiconductor layers forming the laser cavity 1.

The other construction of the semiconductor laser shown here is the same as that of the semiconductor laser shown in FIG. 1. So, its explanation is omitted.

Figure 7:
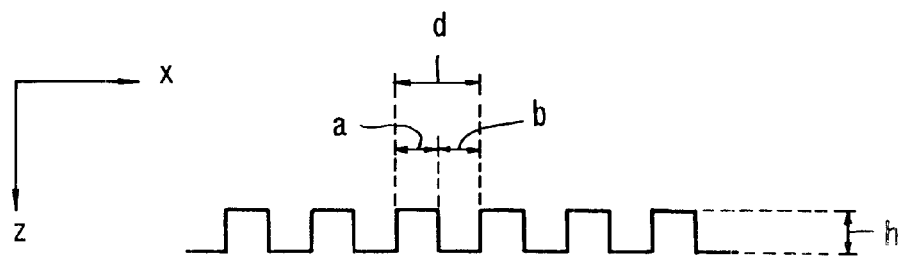
FIG. 7 is a schematic diagram showing a rugged structure on a cavity edge of the semiconductor laser shown in FIG. 6.

FIG. 7 is a schematic diagram showing the rugged structure on the cavity edge 2 to show an aspect of the rugged structure when the cavity edge 2 is viewed from the direction vertical to the xz plane in FIG. 6. In FIG. 7, dimension d represents the rugged cycle of the rugged structure (repetitive distance of concave portions or convex portions), and dimension h represents the depth of each concave portion (or height of each convex portion) in the rugged structure. If the width of each concave portion is a, and the width of each convex portion is b, then the rugged cycle d is expressed by d=a+b. In this case, the rugged structure has a rectangular cross-sectional configuration. The same rugged structure is formed also on the other cavity edge 3.

Figure 8:
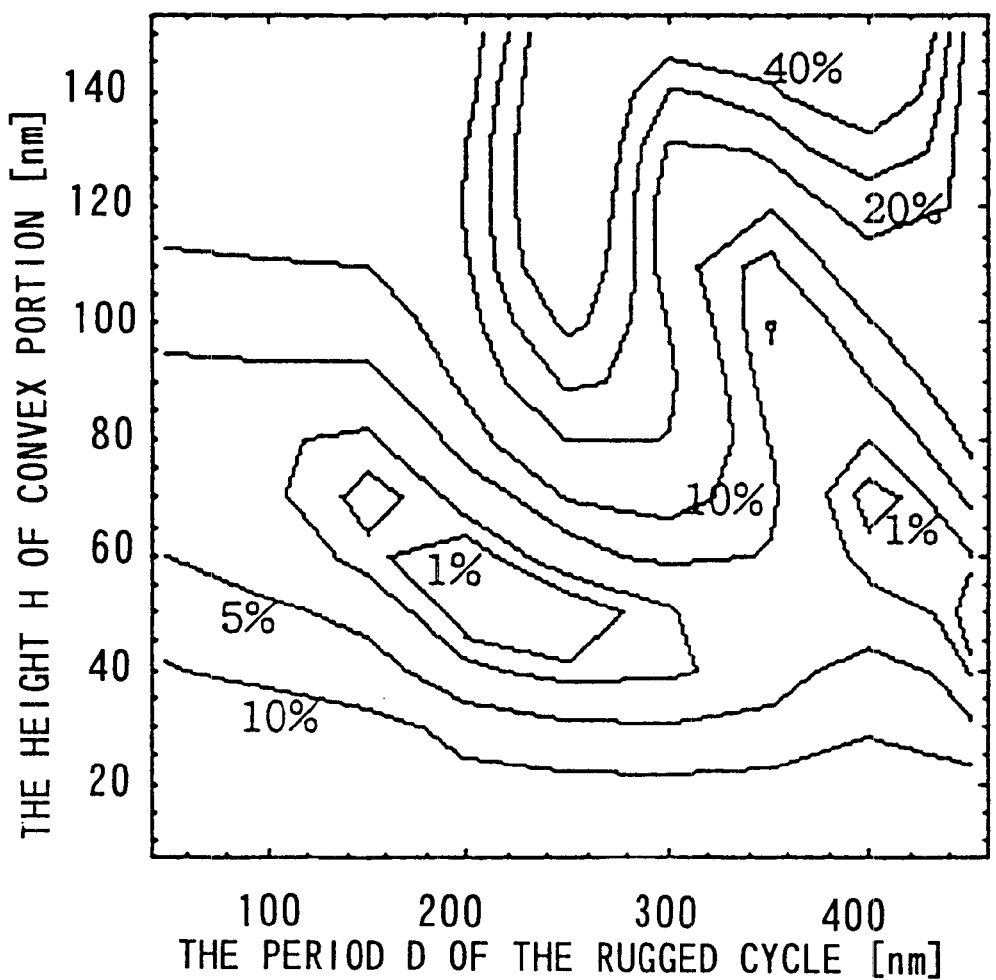
FIG. 8 is a graph showing a result of RCWA calculation by of reflectance of a cavity edge of the semiconductor laser shown in FIG. 6, letting its oscillation wavelength be λ=420 nm.

Assume here that the semiconductor laser is a GaN semiconductor laser having the oscillation wavelength $\lambda=420$ nm. FIG. 8 shows the relation of reflectance of the cavity edge obtained by RCWA with the rugged cycle d and the height d (nm) of the convex portion, taking the case where the rugged structure having a rectangular cross-sectional configuration is formed on the cavity edge (GaN/air interface) (see FIGS. 6 and 7) in the GaN semiconductor laser of $\lambda=420$ nm. In FIG. 8, the abscissa is the rugged cycle d (nm), the ordinate is the convex height h (nm), and edge reflectance is shown by contour lines on the d-h plane. Here are assumed as the rugged duty ratio in the rugged structure (width b of the convex portion/rugged cycle d) being 1/2, polarized light of the laser light being straight-polarized light, and the direction of its electric field being parallel to bonded surfaces of semiconductor layers forming the laser cavity 1.

It is noted from FIG. 8 that, in the case of the grating-shaped rugged structure having the cycle in the direction parallel to bonded surfaces of semiconductor layers forming the laser cavity 1, reflectance of the cavity edge changes from approximately 0.5% (for example, d=250 nm, h=50 nm) to approximately 55% (for example, d=250 nm, h=140 nm), depending upon the rugged cycle d and the convex height h. Since reflectance of the flat GaN/air interface is constantly about 18%, it is understood that, by making the above-mentioned rugged structure on the cavity edge, reflectance of the cavity edge can be readily controlled from a low reflectance around 1% to a high reflectance as high as 50% or more by appropriately determining the rugged cycle of the rugged structure and the height h of the convex portion without applying multi-layered thin-film coating. However, the rugged cycle d is preferably shorter than the oscillation wavelength λ from the viewpoint of ensuring that the rugged structure never diffracts outgoing light from the cavity edge. Thus, even with the rugged structure on the cavity edge, outgoing light can be taken out as a single luminous flux.

Although FIG. 8 shows the result of calculation of reflectance obtained when the grating-shaped rugged structure with the rugged cycle d is formed on the cavity edge, reflectance of approximately 30% or more is obtained in the range of rugged cycle d from 250 to 400 nm when the height h of the convex portion is approximately 140 nm, for example, and reflectance of approximately 1% or less is obtained in the range of the convex height h from 50 to 60 nm when the rugged cycle d is 200 nm. From these facts, for obtaining a desired reflectance, the rugged structure will not need to be a grating of a substantially complete single cycle, but a certain degree of fluctuation will be acceptable for the repetitive distance of concave or convex portions and/or the convex height (concave depth).

A semiconductor laser as shown in FIG. 6, namely, a semiconductor laser having formed on its cavity edges the rugged structures made up of concave portions and/or convex portions extending substantially parallel to bonded surfaces of semiconductor layers forming the laser cavity, can be fabricated easily, for example, in an etched mirror laser, by etching semiconductor layers by dry etching or wet etching using a mask of a configuration corresponding to the rugged structure upon making etching edges as cavity edges (see Japanese Patent Application No. hei 8-341619 on details thereof).

Taking account of the foregoing discussion, embodiments of the invention are explained below with reference to the drawings.

Figure 9:
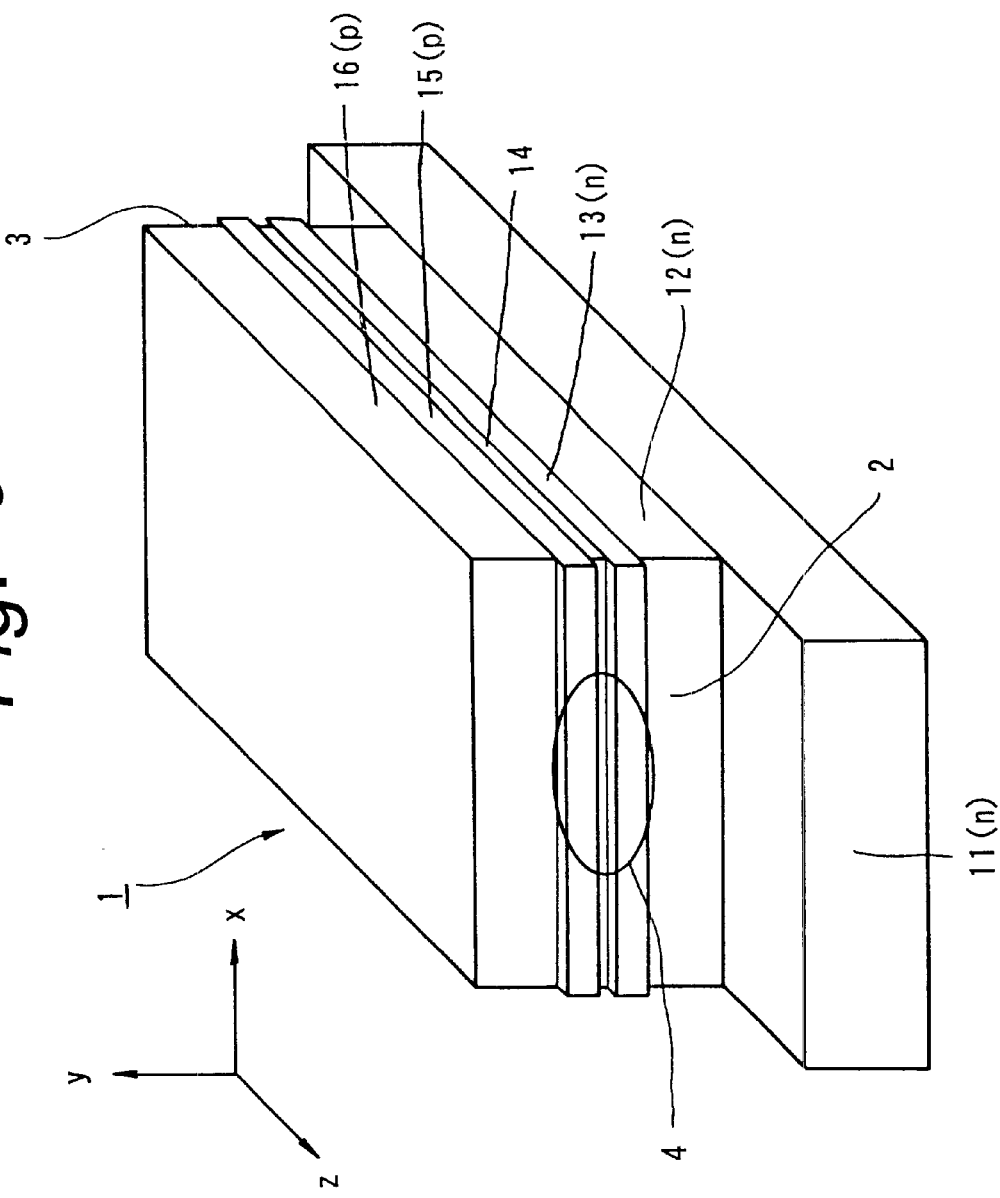
FIG. 9 is a perspective view of a semiconductor laser according to the first embodiment of the invention.

First explained is the first embodiment of the invention. FIG. 9 is a perspective view of a semiconductor laser according to the first embodiment. This laser is a GaN semiconductor laser with the oscillation wavelength λ=400 nm, and its laser cavity 1 is an etched mirror laser having etching edges as its cavity edges 2, 3. In FIG. 9, the x direction corresponding to the direction parallel to stacked surfaces of semiconductor layers forming the laser cavity, the y direction corresponds to the direction vertical to the stacked surfaces of the semiconductor layers forming the laser cavity, and the z direction corresponds to the normal direction of the cavity edges.

As shown in FIG. 9, in the semiconductor laser, a plurality of semiconductor layers forming a laser structure (laser cavity 1), namely, an n-type AlGaN cladding layer 12, n-type GaN optical guide layer 13, InGaN active layer 14, p-type GaN optical guide layer 15 and p-type AlGaN cladding layer 16, are sequentially stacked on an n-type GaN substrate 11, for example. The n-type AlGaN cladding layer 12 and the p-type AlGaN cladding layer 16 are made of $Al_{0.07}Ga_{0.93}N$, for example, and the InGaN active layer 14 is made of $In_{0.15}Ga_{0.85}N$, for example. The n-type GaN substrate 12 may be either a bulk substrate or a structure prepared by stacking an n-type GaN layer on a sapphire substrate via a predetermined buffer layer. In the latter case, the sapphire substrate may be finally removed.

An example of thicknesses of respective semiconductor layers forming the laser cavity 1 is: 0.6 μm of the n-type AlGaN cladding layer 12, 0.2 μm of the n-type GaN optical guide layer 13, 0.1 μm of the InGaN active layer 14, 0.2 μm of the p-type GaN optical guide layer 15, and 0.6 μm of the p-type AlGaN cladding layer 16.

These n-type AlGaN cladding layer 12, n-type GaN optical guide layer 13, InGaN active layer 14, p-type GaN optical guide layer 15 and p-type AlGaN cladding layer 16 are patterned into a predetermined shape of the laser cavity 1 extending in one direction by etching. In this case, these cavity edges 2, 3 are made by etching the semiconductor layers forming the laser cavity 1 in a direction approximately vertical to the major surface of the n-type GaN substrate 11, and the normal direction of these cavity edges 2, 3 approximately coincides with the lengthwise direction of the laser cavity 1.

In the semiconductor laser according to the first embodiment, the rugged structure including elongated concave portions are provided on both cavity edges 2, 3 of the laser cavity 1 to extend in parallel with bonded surfaces of semiconductor layers forming the laser cavity. In this case, the rugged structures on the cavity edges 2, 3 coincide with the multi-layered structure of the semiconductor layers forming the laser cavity 1 such that portions corresponding to the n-type GaN optical guide layer 13 and the p-type GaN optical guide layer 15 are convex whereas portions corresponding to the n-type AlGaN cladding layer 12, InGaN active layer 14 and p-type AlGaN cladding layer 16 are concave. The rugged structures are made as a result of the n-type AlGaN cladding layer 12, InGaN active layer 14 and p-type AlGaN cladding layer 16 being selective etched and excavated along the cavity edges 2, 3 as will be explained later. Reference numeral 4 exhibits a near field pattern lf laser light on the cavity edge 2. The near field pattern 4 is defined by a portion in which the intensity of laser light is not less than $1/e^2$ of the peak value in a Gaussian distribution about the optical axis of the intensity distribution of laser light L in the radial direction of the luminous flux. In this case, radius of the near field pattern 4 in a direction vertical to bonded surfaces of semiconductor layers forming the laser cavity 1 is 0.3 μm, for example.

Figure 10:
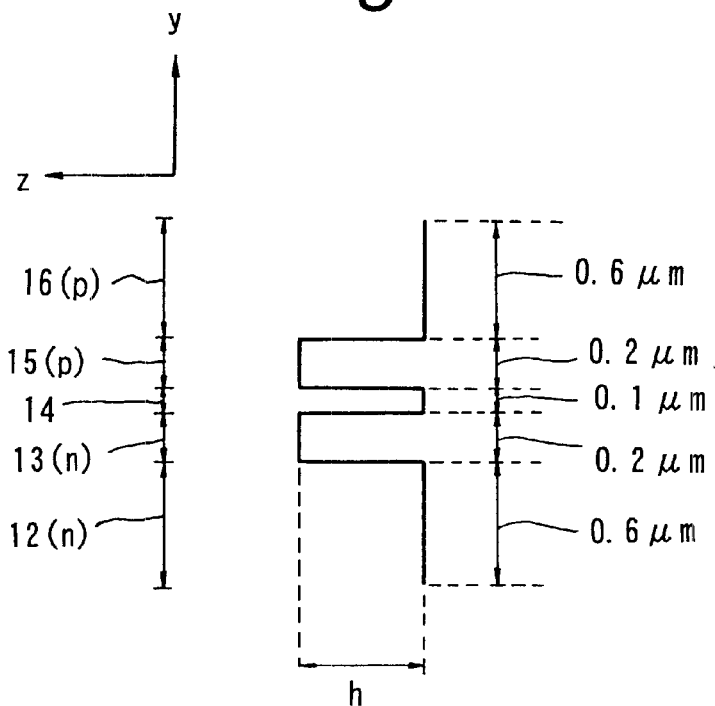
FIG. 10 is a schematic diagram showing an actual rugged structure on a cavity edge of the semiconductor laser according to the first embodiment.
Figure 11:
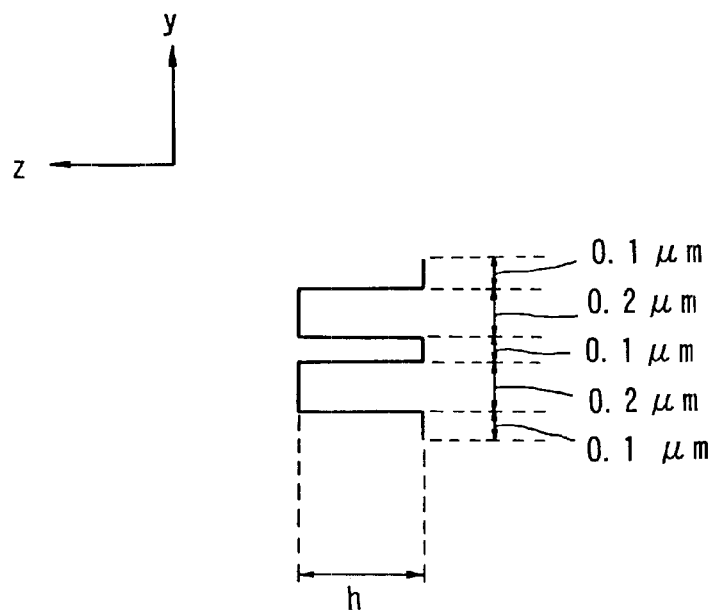
FIG. 11 is a schematic diagram showing an effective rugged structure on a cavity edge, taking account of the size of a near field pattern, in the semiconductor laser according to the first embodiment of the invention.

FIG. 10 is a schematic diagram showing an actual rugged structure on the cavity edge 2 to show an aspect of the rugged structure when the cavity edge 2 is viewed from a direction vertical to the yz plane in FIG. 9. In contrast, FIG. 11 is a schematic diagram showing an effective rugged structure on the cavity edge 2 when the size of the near field pattern 4 is taken into consideration, to show, here again, an aspect of the rugged structure when the cavity edge 2 is viewed from a direction vertical to the yz plane in FIG. 9. In FIGS. 10 and 11, dimension h represents the concave depth (convex height) of the rugged structure.

As shown in FIG. 10, in the actual rugged structure on the cavity edge 2, concave width at the portion corresponding to the n-type AlGaN cladding layer 12 is 0.6 μm, convex width at the portion corresponding to the n-type GaN optical guide layer 13 is 0.2 μm, concave width at the portion corresponding to the InGaN active layer 14 is 0.1 μm, convex width at the portion corresponding to the p-type GaN optical guide layer 15 is 0.2 μm, and concave width at the portion corresponding to the p-type AlGaN cladding layer 16 is 0.6 μm. In this case, the rugged structure has a rectangular cross-sectional configuration. The same rugged structure is also made on the other cavity edge 3.

In contrast, when taking account of the size of the near field pattern 4, the effective rugged structure on the cavity edge 2 can be regarded as a grating in which concave portions of the width a=0.1 μm and convex portions of the width b=0.2 μm are formed periodically as shown in FIG. 11. In this case, the rugged cycle d in the grating-shaped rugged structure is 0.3 μm, the rugged duty ratio (convex width b/rugged cycle d) is 2/3. The same applies also to the other cavity edge 3.

Figure 12:
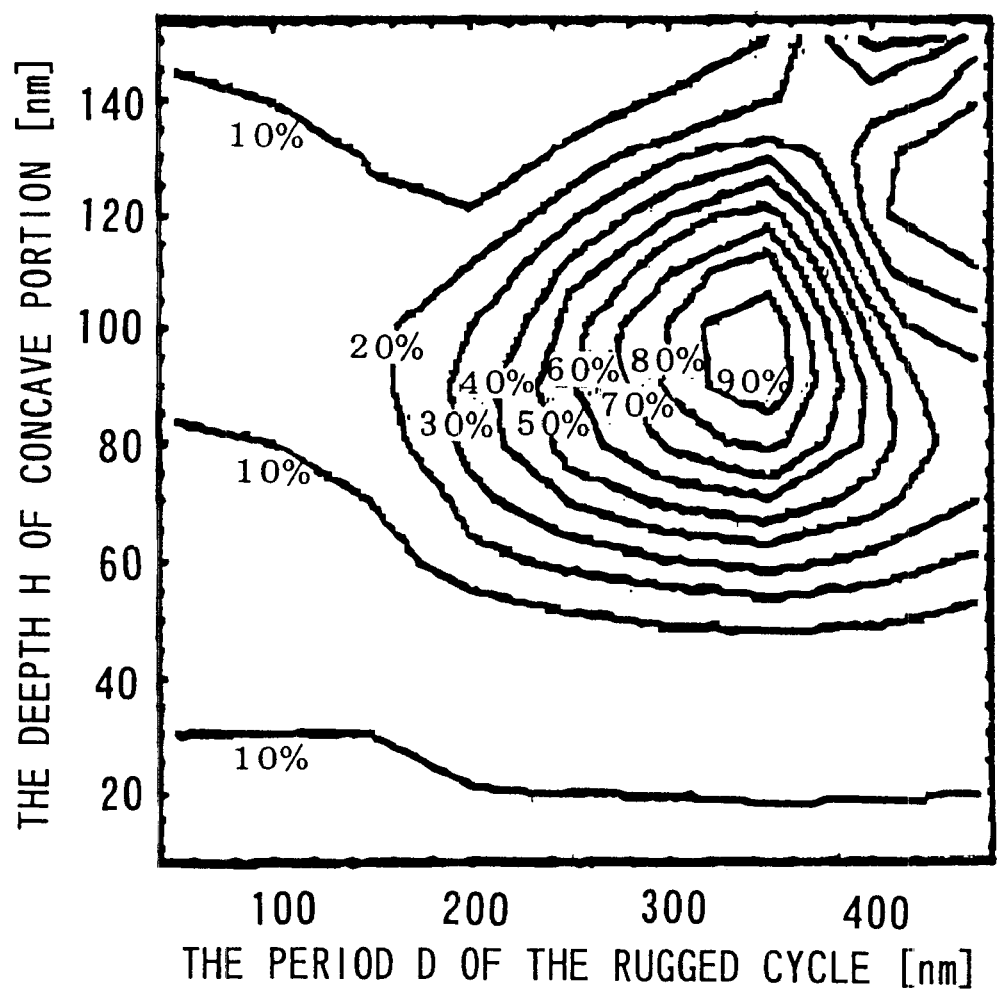
FIG. 12 is a graph showing a result of RCWA calculation by of reflectance of a cavity edge of the semiconductor laser according to the first embodiment.

FIG. 12 shows the relation of reflectance of the cavity edge obtained by RCWA with the rugged cycle d and the height h (nm) of the convex portion, taking the case where the rugged structure having a rectangular cross-sectional configuration is formed on the cavity edge (GaN/air interface) (see FIGS. 9 through 11). In FIG. 12, the abscissa is the rugged cycle d (nm), the ordinate is the convex height h (nm), and edge reflectance is shown by contour lines on the d-h plane. Here are assumed as the rugged duty ratio b/d in the rugged structure being 2/3, polarized light of the laser light being straight-polarized light, and the direction of its electric field being parallel to bonded surfaces of semiconductor layers forming the laser cavity 1.

It is noted from FIG. 12 that, by controlling the concave depth h, reflectance of the cavity edge having formed the grating-shaped rugged structure with the rugged cycle d=300 nm changes from a low reflectance around 1% (for example, h=40 nm) to a high reflectance around 90% (for example, h=90 nm).

In the semiconductor laser according to the first embodiment, the rugged structures as shown in FIGS. 10 and 11 are made on both cavity edges 2, 3 of the laser cavity 1, respectively, and the concave depth h of the rugged structure on the cavity edge 2 and the concave depth h of the rugged structure on the cavity edge 3 are controlled independently such that these cavity edges 2, 3 have different values of reflectance. In an example, when the concave depth h of the rugged structure on the cavity edge 2 is 60 nm, reflectance of the cavity edge 2 is 30%. When the concave depth h of the rugged structure on the cavity edge 3 is 95 nm, reflectance of the cavity edge 3 is 80%.

As explained above, in the semiconductor laser according to the first embodiment, it is possible to realize desired reflectance values at the cavity edges 2, 3 by independently controlling the concave widths h in the rugged structures on the cavity edges 2, 3.

Next explained is a manufacturing method of the semiconductor laser according to the first embodiment.

For manufacturing the semiconductor laser, first grown sequentially on the n-type GaN substrate 11 are the n-type AlGaN cladding layer 12, n-type GaN optical guide layer 13, InGaN active layer 14, p-type GaN optical guide layer 15 and p-type AlGaN cladding layer by MOCVD. Next formed on the p-type AlGaN cladding layer 15 is an etching mask (not shown) of a shape corresponding to the laser cavity 1. Using the etching mask, the p-type AlGaN cladding layer 16, p-type GaN optical guide layer 15, InGaN active layer 14, n-type GaN optical guide layer 13 and n-type AlGaN cladding layer 12 are selectively removed by dry etching such as reactive ion etching (RIE) substantially vertically to the major surface of the n-type GaN substrate 11. As a result, these semiconductor layers are patterned into the predetermined shape of the laser cavity 1, and simultaneously therewith, the cavity edges, which are etching edges, are formed at opposite ends of the laser cavity 1. Thereafter, the etching mask is removed.

After that, the portion other than the cavity edge 2, for example, is covered by a resist pattern, and the cavity edge 2 is processed by wet etching using a predetermined etchant. As a result, as shown in FIG. 10, the rugged structure is formed on the cavity edge 2, in which portions corresponding to the n-type GaN optical guide layer 13 and the p-type GaN optical guide layer 15 are convex whereas portions corresponding to the n-type AlGaN cladding layer 12, InGaN active layer 14 and p-type AlGaN cladding layer 16 are concave. At that time, the etching depth, namely, the concave depth h, is controlled by appropriately adjusting the etching time so as to obtain a desired reflectance at the cavity edge 2. A GaN layer added with Al or In (AlGaN layer or InGaN layer) is usually different from a non-doped GaN layer in chemical property. Therefore, it is essentially possible to realize a rugged structure as shown in FIG. 10 by controlling wet etching conditions. Next, by processing the cavity edge 3 by etching in the same manner, the same rugged structure is made also on the cavity edge 3.

Through these processes, the semiconductor laser having formed on its cavity edges 2, 3 the rugged structure with concave portions and/or convex portions extending substantially in parallel with bonded surfaces of semiconductor layers forming the laser cavity 1 is obtained as shown in FIG. 9.

As explained above, in the semiconductor laser according to the first embodiment, since the rugged structures made up of concave portions extending substantially in parallel with bonded surfaces of semiconductor layers forming the laser cavity 1 are made on the cavity edges 2, 3, reflectance at the cavity edges 2, 3 can be readily controlled without using multi-layered thin-film coating techniques. More specifically, by controlling the concave depth h, for example, of the rugged structures on the cavity edges 2, 3, reflectance at the cavity edges 2, 3 can be set to any desired value in the range from a low reflectance around 1% to a high reflectance around 85%.

In the manufacturing method of the semiconductor laser according to the first embodiment, since the rugged structures are made by first making etching edges as cavity edges 2, 3 and then processing these cavity edges 2, 3 by wet etching, these rugged structures can be made with a remarkable reproducibility, using differences in chemical property among respective semiconductor layers forming the laser cavity 1 due to differences in composition among them. Additionally, since the method can fabricate the entirety of the semiconductor laser in a wafer process, semiconductor lasers required to be controlled in reflectance of cavity edges can be manufactured easily.

Figure 13:
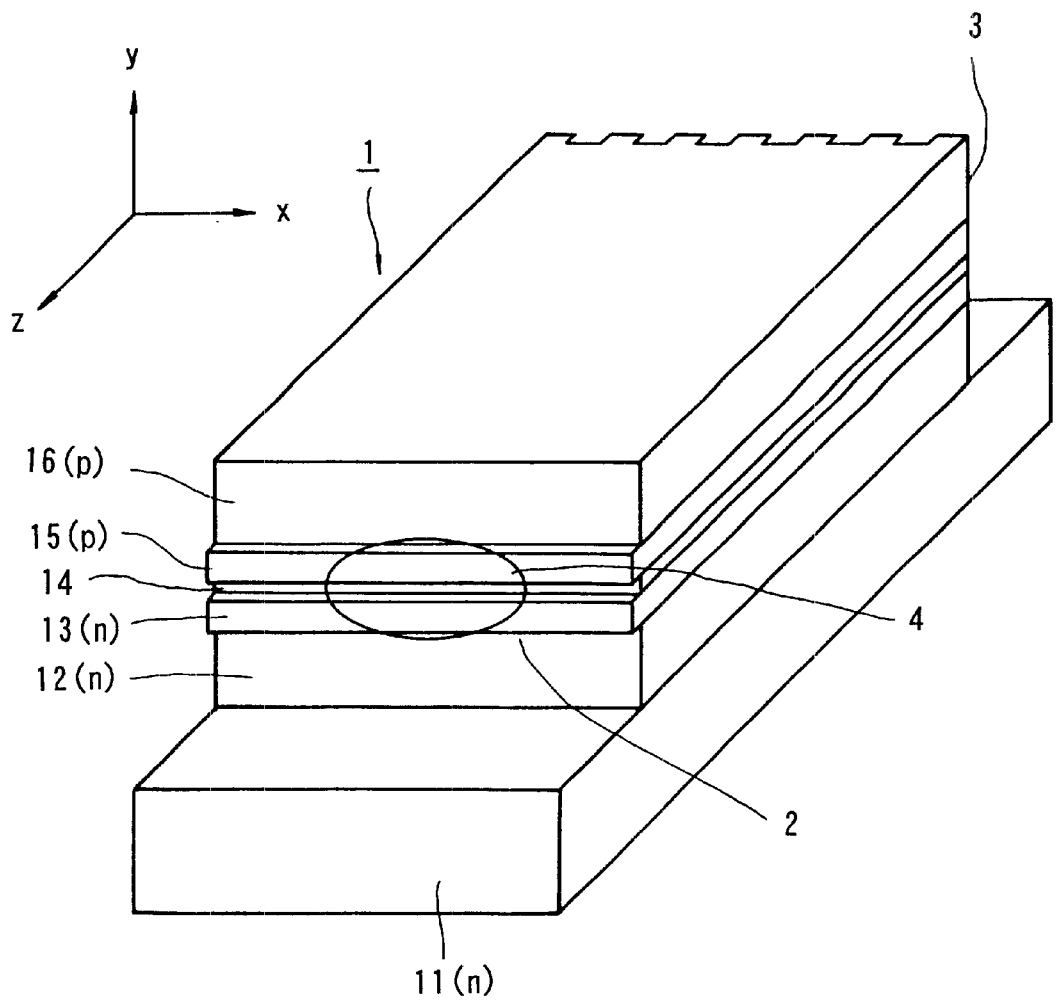
FIG. 13 is a perspective view of a semiconductor laser according to the second embodiment of the invention.

Next explained is the second embodiment of the invention. FIG. 13 is a perspective view of a semiconductor laser according to the second embodiment. This laser is a GaN semiconductor laser with the oscillation wavelength λ=400 nm, and its laser cavity 1 is an etched mirror laser having etching edges as its cavity edges 2, 3. In FIG. 13, the same or corresponding components as those of FIG. 9 are labeled with common reference numerals.

As shown in FIG. 13, in the semiconductor laser, made on one cavity edge 2 is the same rugged structure as that of the semiconductor laser according to the first embodiment. In contrast, made on the other cavity edge 3 is a rugged structure including elongated concave portions and convex portions extending in a direction substantially vertical to bonded surfaces of semiconductor layers forming the laser cavity 1. The rugged structure on the cavity edge 3 is made, for example, by etching the cavity edge 3 to dig concave portions into the cavity edge 3.

Figure 14:
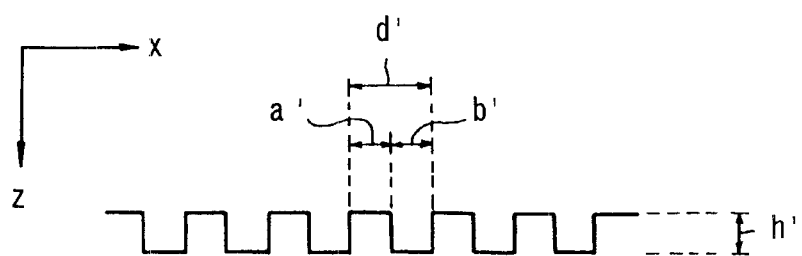
FIG. 14 is a schematic diagram showing a rugged structure on a cavity edge of the semiconductor laser according to the second embodiment of the invention.

FIG. 14 is a schematic diagram showing the rugged structure on the cavity edge 3 to show an aspect of the rugged structure when the cavity edge 3 is viewed from the direction vertical to the xz plane in FIG. 13. In FIG. 14, dimension d' represents the rugged cycle of the rugged structure, and dimension h' represents the concave depth (or convex height). If the width of each concave portion is a', and the width of each convex portion is b', then the rugged cycle d' is expressed by d'=a'+b'.

As shown in FIG. 14, the rugged structure on the cavity edge 3 is in form of a grating having a predetermined rugged cycle d' in a direction substantially parallel to bonded surfaces of semiconductor layers forming the laser cavity 1, for example. The rugged cycle d' in the grating-shaped rugged structure is shorter than the oscillation wavelength λ, for example, and the rugged duty ratio (convex width b'/rugged cycle d') is 1/2, for example. Reflectance of the cavity edge 3 is controlled by appropriating selecting the rugged cycle d' in the grating-shaped rugged structure on the cavity edge 3, rugged duty ratio b'/d', convex height h' or concave depth) and cross-sectional configuration. In this case, reflectance at the cavity edge 3 can be obtained by RCWA like that in the model of semiconductor laser shown in FIG. 6.

In the other structural respects, the semiconductor laser according to the second embodiment is the same as the semiconductor laser according to the first embodiment. So, its explanation is omitted.

For manufacturing the semiconductor laser according to the second embodiment, in the process of making the cavity edges 2, 3 by etching, semiconductor layers at the edge on the part of the cavity edge 3 are processed by etching using a mask of a shape corresponding to the rugged structure shown in FIG. 14. In the other respects, the manufacturing method of the semiconductor laser according to the second embodiment is the same as the manufacturing method of the semiconductor laser according to the first embodiment. So, it explanation is omitted.

The second embodiment also ensures the same effects as those of the first embodiment.

Figure 15:
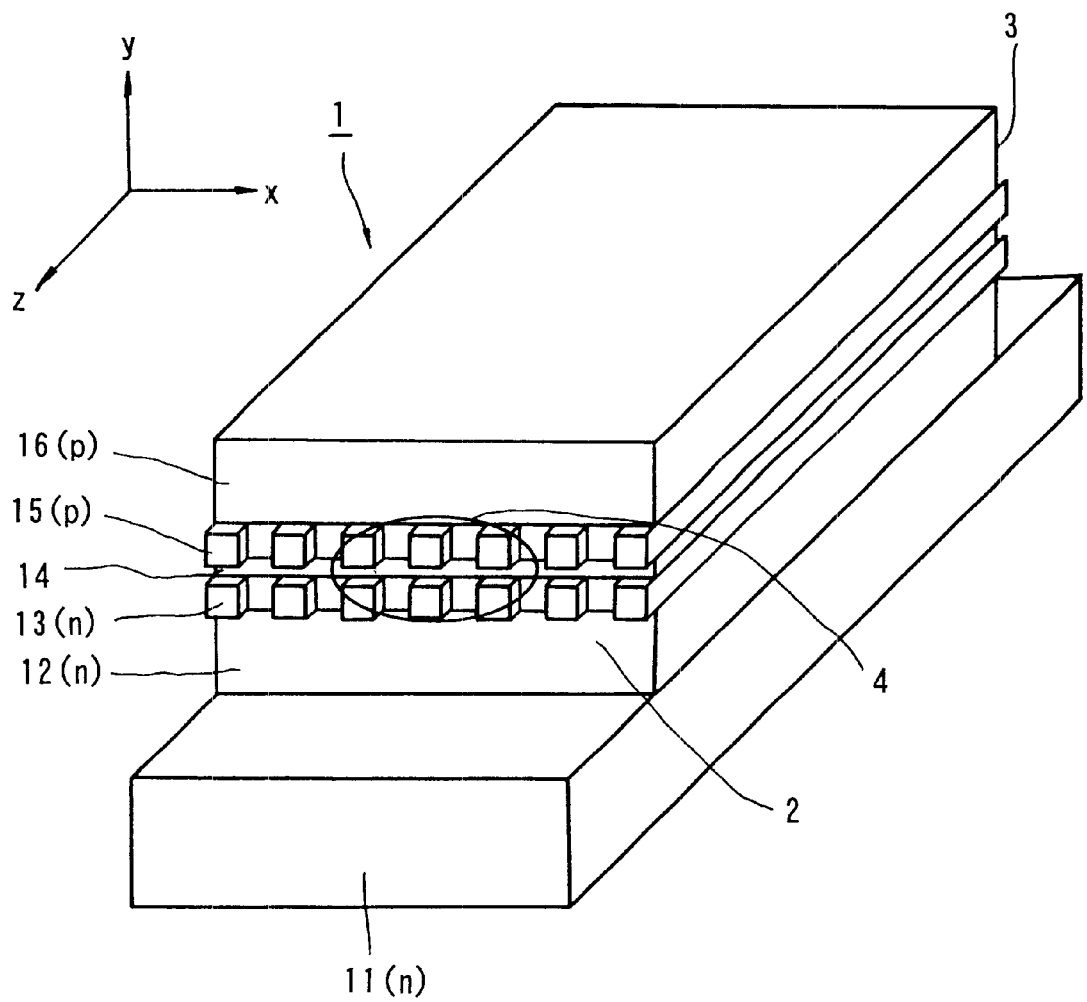
FIG. 15 is a perspective view of a semiconductor laser according to the third embodiment of the invention.

Next explained is the third embodiment of the invention. FIG. 15 is a perspective view of a semiconductor laser according to the third embodiment. This laser is a GaN semiconductor laser with the oscillation wavelength λ=400 nm, and its laser cavity 1 is an etched mirror laser having etching edges as its cavity edges 2, 3. In FIG. 15, the same or corresponding components as those of FIG. 9 are labeled with common reference numerals.

As shown in FIG. 15, in the semiconductor laser, made on both cavity edges 2, 3 are the rugged structures having a plurality of dot-shaped convex portions. In these rugged structures on the cavity edges 2, 3, the dot-shaped convex portions are provided in a two-dimensional arrangement in a direction substantially parallel to bonded surfaces of semiconductor layers forming the laser cavity 1 and a direction substantially vertical to the bonded surfaces to form grid-shaped concave portion. In this case, the dot-shaped convex portions are provided in substantially uniform distribution in portions corresponding to the n-type GaN optical guide layer 13 and the p-type GaN optical guide layer 15 on the cavity edges 2, 3. These rugged structure is formed by etching the cavity edges 2, 3 to excavate them into the grid-shaped concave portion.

In the other structural respects, the semiconductor laser according to the third embodiment is the same as the semiconductor laser according to the first embodiment. So, its explanation is omitted.

For manufacturing the semiconductor laser according to the third embodiment, the rugged structures similar to those in FIG. 9 are first formed on the cavity edges 2, 3 by the same manufacturing method as explained with the first embodiment, and thereafter, portions for the convex portions in the rugged structures are patterned into predetermined forms by etching. In the other respects, the manufacturing method of the semiconductor laser according to the third embodiment is the same as the manufacturing method of the semiconductor laser according to the first embodiment. So, its explanation is omitted.

The third embodiment also ensures the same effects as those of the first embodiment.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, materials and structures introduced in the embodiments are not but examples, and the invention is not limited to them. Specifically, the semiconductor lasers according to the first to third embodiments may be GaN semiconductor lasers for oscillation wavelengths other than λ=400 nm.

The rugged structures on cavity edges 2 and 3 in the first embodiment and the rugged structure on the cavity edges 2 in the second embodiment may be configured such that portions corresponding to the n-type AlGaN cladding layer 12, InGaN active layer 14 and p-type AlGaN cladding layer 16 form convex portions whereas portions corresponding to the n-type GaN optical guide layer 13 and the -type GaN optical guide layer 15 form concave portions.

In the first to third embodiments, coating of a $TiO_2/SiO_2$ multi-layered thin film, for example, may be additionally applied onto the cavity edges having formed the rugged structures. This is useful because the multi-layered thin film serves as a passivation film to thereby improve reliability of the cavity edges and enable adjustment of reflectance.

In the first embodiment, the rugged structures are made on the cavity edges 2, 3 by first etching semiconductor layers forming the laser cavity 1 to form etching edges as cavity edges 2, 3 and thereafter processing the cavity edges 2, 3 by wet etching to form the rugged structures. However, upon etching semiconductor layers forming the laser cavity 1 to form etching edges as cavity edges 2, 3, the rugged structures can be made simultaneously with these cavity edges 2, 3 by controlling the dry etching conditions.

In the first to third embodiments, the rugged structures on the cavity edges are made by making concave portions into cavity edges by etching. However, these rugged structures may be made by making convex portions by stacking films on the cavity edges, for example.

The laser cavity 1 in the first to third embodiment may have a double-hetero structure. Furthermore, although the first to third embodiments have been explained as applying the invention to an etched mirror laser, the invention is also applicable to a pseudo surface-emitting laser made by incorporating a rasing mirror or a cleaved laser having cleaved surfaces as its cavity edges.

The first to third embodiments have been explained as applying the invention to GaN semiconductor lasers. However, the invention is applicable, needless to say, to GaN light emitting diodes, and not only to semiconductor light emitting devices using these nitride III–V compound semiconductors but also to semiconductor light emitting devices using other III–V compound semiconductors, such as AlGaAs semiconductor light emitting devices and AlGaInP semiconductor light emitting devices and semiconductor light emitting devices using II–VI compound semiconductors.

As described above, according to the semiconductor light emitting device introduced as the first aspect of the invention, reflectance of cavity edges can be controlled easily without using multi-layered thin-film coating techniques because at least one of its cavity edges has formed a rugged structure which includes concave portions and/or convex portions extending substantially in parallel with bonded surfaces of semiconductor layers forming the cavity.

According to the semiconductor light emitting device introduced as the second aspect of the invention, reflectance at cavity edges can be controlled easily without using multi-layered thin-film coating techniques similarly to the first aspect of the invention because at least one of its cavity edges has formed a rugged structure including dot-shaped concave portions and/or convex portions.

In the first and the second inventions, the reflection of the cavity edge having the rugged structure is controllable by setting repetitive distance of the concave portions or the convex portions of the rugged structure, depth of the concave portions or height of the convex portions of the rugged structure, duty ratio of the rugged structure and cross-sectional configuration of the rugged structure, therefore, it is especially efficient for increasing refractive indices of their cavity edges with a semiconductor light emitting device capable of oscillating between the range of blue-violet and ultraviolet light. Also, a high reflectance can be easily realized in the light emitting device, even if a suitable transparent material with high reflectance is not available for oscillation wavelength because of the difficult case of multi-layered thin-film coating for a high reflectance.

According to the manufacturing method of the semiconductor light emitting device introduced as the third aspect of the invention, since rugged structures are formed by making concave portions on cavity edges by etching upon manufacturing the semiconductor light emitting device according to the first invention, so that differences in chemical property among respective semiconductor layers forming the cavity due to their differences in composition or the presence or absence of distortion at their bonded surfaces result in making the rugged structures, a repetitive distance of concave portions and/or convex portions of the rugged structures and a duty ratio of the rugged structures can be realized with a remarkable reproducibility. Especially when the semiconductor light emitting device to be manufactured is an etched mirror laser having etching edges as its cavity edges, all can be manufactured in a wafer process. Therefore, semiconductor light emitting devices required to be controlled in reflectance of its cavity edges can be manufactured easily.

The manufacturing method of the semiconductor light emitting device according to the third aspect of the invention is particularly effective when used for manufacturing an etched mirror laser because high reflectance can be realized by controlling the concave depth in the rugged structures on cavity edges in an etched mirror laser liable to produce irregularity on cavity edges and liable to decrease in reflectance of cavity edges in its manufacturing process.

What is claimed is:

1. A semiconductor light emitting device comprising a rugged structure including concave portions and convex portions made on a cavity edge of a cavity thereof to extend substantially in parallel with epitaxy_bonded surfaces of at least four semiconductor layers forming said cavity wherein said concave portions or said convex portions have a repetitive distance in said rugged structure that is shorter than a wave length of outgoing light from said cavity edge.

2. The semiconductor light emitting device according to claim 1 wherein reflectance of a cavity edge having said rugged structure is controlled by repetitive distance of said concave portions or said convex portions of said rugged structure, depth of said concave portions or height of said convex portions of said rugged structure, duty ratio of said rugged structure and cross-sectional configuration of said rugged structure.

3. The semiconductor light emitting device according to claim 2 wherein reflectance of said cavity edge having said rugged structure is controlled so that reflectance of one said concave portions and said convex portions of rugged structure of said cavity edge is different from reflectance of another said concave portions or said convex portions of rugged structure on another cavity edge.

4. The semiconductor light emitting device according to claim 1 wherein a cavity edge having formed said rugged structure is coated with a single-layered or multi-layered film.

5. The semiconductor light emitting device according to claim 1 wherein said rugged structure is formed by making said concave portions on said cavity edge by etching.

6. The semiconductor light emitting device according to claim 5 wherein said rugged structure is formed by using differences in chemical property among said at least four$_{13}$ semiconductor layers forming said cavity caused by differences in composition among them.

7. The semiconductor light emitting device according to claim 1 wherein said rugged structure is formed by making said convex portions by stacking a film on said cavity edge.

8. The semiconductor light emitting device according to claim 1 wherein said at least four_semiconductor layers forming said cavity are made of nitride III–V compound semiconductors.

9. A semiconductor light emitting device comprising a rugged structure including dot-shaped concave portions and/or convex portions made on at least one of cavity edges of a cavity thereof to extend substantially in parallel with epitaxy bonded surfaces of at least four semiconductor layers.

10. The semiconductor light emitting device according to claim 9 wherein said rugged structure had a grid-like configuration in which said concave portions and/or said convex portion have an edge aligned substantially in parallel with epitaxy bonded surfaces of at least four semiconductor layers forming said cavity and another edge in a direction approximately vertical to said bonded surfaces.

11. The semiconductor light emitting device according to claim 9 wherein reflectance of a cavity edge having said rugged structure is controlled by repetitive distance of said concave portions or said convex portions of said rugged structure, depth of said concave portions or height of said convex portions of said rugged structure, duty ratio of said rugged structure and cross-sectional configuration of said rugged structure.

12. The semiconductor light emitting device according to claim 10 wherein reflectance of a cavity edge having said rugged structure is controlled so that reflectance of one of said cavity edges of said cavity be different from reflectance of the other cavity edge.

13. The semiconductor light emitting device according to claim 9 wherein said repetitive distance of said concave portions or said convex portions in said rugged structure is shorter than the wavelength of outgoing light from said cavity edge.

14. The semiconductor light emitting device according to claim 9 wherein said cavity edge having formed said rugged structure is coated with a single-layered or multi-layered film.

15. The semiconductor light emitting device according to claim 9 wherein said at least four semiconductor layers forming said cavity are made of nitride III–V compound semiconductors.

* * * * *